(12) United States Patent  (10) Patent No.: US 8,680,509 B2
Ooshika et al.  (45) Date of Patent: Mar. 25, 2014

(54) NITRIDE SEMICONDUCTOR DEVICE AND METHOD OF PRODUCING THE SAME

(75) Inventors: Yoshikazu Ooshika, Tokyo (JP); Tetsuya Matsuura, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 52 days.

(21) Appl. No.: 13/391,976

(22) PCT Filed: Aug. 23, 2010

(86) PCT No.: PCT/JP2010/064653
§ 371 (c)(1),
(2), (4) Date: Feb. 23, 2012

(87) PCT Pub. No.: WO2011/024979
PCT Pub. Date: Mar. 3, 2011

(65) Prior Publication Data
US 2012/0175589 A1  Jul. 12, 2012

(30) Foreign Application Priority Data

Aug. 24, 2009 (JP) .................................. 2009-193090
Mar. 1, 2010 (JP) .................................. 2010-044744
Aug. 18, 2010 (JP) .................................. 2010-183420

(51) Int. Cl.
*H01L 33/06* (2010.01)
*H01L 29/15* (2006.01)
*H01L 21/20* (2006.01)
*H01L 33/32* (2010.01)

(52) U.S. Cl.
USPC .. 257/22; 257/12; 257/E21.09; 257/E29.072; 257/E33.008; 257/E33.032; 438/47; 438/478

(58) Field of Classification Search
CPC B82Y 20/00; H01L 21/0254; H01L 21/0237; H01L 33/04; H01L 33/12; H01L 33/32; H01L 33/007

USPC ....................... 257/12, 13, 15, 18, 22, E21.09, 257/E29.072, E33.008, E33.032
See application file for complete search history.

(56) References Cited

U.S. PATENT DOCUMENTS 5,747,827 A * 5/1998 Duggan et al. .................. 257/15
2008/0063020 A1 3/2008 Fukuda et al.
2009/0127583 A1* 5/2009 Ohachi et al. ................. 257/190

FOREIGN PATENT DOCUMENTS

JP   A-2001-77412   3/2001
JP   A-2009-158804  7/2009
WO   WO 2006/030845 A1  3/2006

OTHER PUBLICATIONS

Office Action issued in Korean Application No. 10-2012-7007628 dated Mar. 15, 2013 (with translation).
Adivarahan et al., "Robust 290nm Emission Light Emitting Diodes over Pulsed Laterally Overgrown AlN," *Japanese Journal of Applied Physics*, Sep. 14, 2007, vol. 46, No. 36, L877-L879.

(Continued)

*Primary Examiner* — Matthew W Such
*Assistant Examiner* — David Spalla
(74) *Attorney, Agent, or Firm* — Oliff PLC (57) ABSTRACT

A nitride semiconductor device is provided, in which a superlattice strain buffer layer using AlGaN layers having a low Al content or GaN layers is formed with good flatness, and a nitride semiconductor layer with good flatness and crystallinity is formed on the superlattice strain buffer layer. A nitride semiconductor device includes a substrate; an AlN strain buffer layer made of AlN formed on the substrate; a superlattice strain buffer layer formed on the AlN strain buffer layer; and a nitride semiconductor layer formed on the superlattice strain buffer layer, and is characterized in that the superlattice strain buffer layer has a superlattice structure formed by alternately stacking first layers made of $Al_xGa_{1-x}N$ ($0 \leq x \leq 0.25$), which further contain p-type impurity, and second layers made of AlN.

11 Claims, 7 Drawing Sheets

(56) References Cited

OTHER PUBLICATIONS

Nanjo et al., "First Operation of AlGaN Channel High Electron Mobility Transistors," *Applied Physics Express,* vol. 1 (2008), pp. 011101-1 through 011101-3.

Sep. 21, 2010 Office Action issued in Japanese Patent Application No. 2010-183420 (with translation).
Sep. 21, 2010 International Search Report issued in International Patent Application No. PCT/JP2010/064653.

* cited by examiner

Photoluminescence emission wavelength (nm)

NITRIDE SEMICONDUCTOR DEVICE AND METHOD OF PRODUCING THE SAME

TECHNICAL FIELD

The present invention relates to a nitride semiconductor device and a method of producing the nitride semiconductor device.

RELATED ART

In recent years, ultraviolet LEDs (light emitting diodes) which emit light in an ultraviolet region, particularly of which emission wavelength is less than 365 nm, have attracted attention as LEDs that can be favorably used in the fields of sterilization, water purification, medical treatment, illumination, high-density optical recording, and the like. Further, in recent years, electronic devices such as HEMTs using compound semiconductors are also attracting attention.

Devices having a device structure formed using an AlGaN-based thin film as a device material are known as such ultraviolet LEDs. Further, with respect to ultraviolet LEDs having a device structure formed using such an AlGaN-based thin film, various approaches have been made to improve light output power of the ultraviolet LEDs by obtaining high quality AlGaN-based thin films.

Specifically, ultraviolet LEDs have been developed in which an AlN strain buffer layer (AlN template) is provided on a substrate, and besides, a superlattice strain buffer layer of $Al_aGa_{1-a}N/Al_bGa_{1-b}N$ ($0 \leq a$, $b \leq 1$, $a > b$) is provided between the AlN strain buffer layer and an n-type nitride semiconductor (n-type AlGaN layer), thereby controlling thin-film stress and preventing cracks from generating in the n-type AlGaN layer to improve light output power (for example, see Vinod Adivarahan et al., "Robust 290 nm Emission Light Emitting Diodes over Pulsed Laterally Overgrown AlN", Japanese Journal of Applied Physics, Vol. 46, No. 36, P. 877 (2007)).

However, the light output power of the above ultraviolet LEDs (nitride semiconductor devices) has not been sufficient.

As electronic devices such as HEMTs using compound semiconductors as described above, nitride semiconductor devices using nitride semiconductors are known. With respect to such HEMTs using nitride semiconductors, various approaches have been made to improve the current characteristics.

In particular, HEMTs have been developed in which a buffer layer (GaN layer) is formed on a substrate, a channel layer made of an undoped nitride semiconductor (i-type AlGaN layer) and a barrier layer are provided on the buffer layer, and Si is injected to source/drain regions, thereby realizing low contact resistance (for example, see Takuma Nanjo et al., "First Operation of AlGaN Channel High Electron Mobility Transistors", Applied Physics Express, Vol. 1 (2008)).

However, with respect to the above-described HEMTs, the flatness of the surface of the channel layer (i-type AlGaN layer) formed on the buffer layer made of GaN is not sufficient; thus, sufficient current characteristics cannot been obtained with the HEMTs.

PRIOR ART DOCUMENT

Patent Document

[Non-patent Document 1] Vinod Adivarahan et al., "Robust 290 nm Emission Light Emitting Diodes over Pulsed Laterally Overgrown AlN", Japanese Journal of Applied Physics, Vol. 46, No. 36, P. 877 (2007)

[Non-patent Document 2] Takuma Nanjo et al., "First Operation of AlGaN Channel High Electron Mobility Transistors", Applied Physics Express, Vol. 1 (2008)

DISCLOSURE OF THE INVENTION

Problems to be Solved by the Invention

Here, in view of the problem of current characteristics of nitride semiconductor devices (electronic devices such as HEMTs) as described above, the present inventors found that current characteristics, for example, sheet resistance and the like of the nitride semiconductor devices can be improved by forming a superlattice strain buffer layer with good flatness on a substrate, in which GaN or AlGaN having a low Al content and AlN are combined, and thus improving crystallinity of a nitride semiconductor layer to be stacked on the superlattice strain buffer layer.

Therefore, the present inventors have intensively studied for the purpose of developing a nitride semiconductor device excellent in current characteristics, in which a superlattice strain buffer layer using AlGaN layers having a low Al content or GaN layers is formed with good flatness on a substrate, and besides, a nitride semiconductor layer is formed on the superlattice strain buffer layer with good flatness and crystallinity; and for the purpose of developing a method of producing such a device.

Further, in view of the problem of light output power of nitride semiconductor devices (ultraviolet LEDs) as described above, the present inventors found that a superlattice strain buffer layer in which GaN or AlGaN having a low Al content and AlN are combined is effective for improving crystallinity of a layer stacked thereon and thus enhancing light output power of a nitride semiconductor device. However, GaN or AlGaN having a low Al content which has a band gap smaller than the emission wavelength of an ultraviolet region serves as a light absorbing element in a light emitting device; therefore, the amount of GaN or AlGaN having a low Al content in the superlattice strain buffer layer is preferably reduced as much as possible. Thus, the present inventors have tried to minimize the thickness of layers made of GaN or AlGaN having a low Al content in the superlattice strain buffer layer.

Here, an AlN layer grows relatively flat on an AlN template. However, with respect to GaN or AlGaN having a low Al content, the crystal growth rate in the lateral direction on the AlN is low, so accordingly, as the thickness of a layer of such an material is small, it is significantly more difficult to obtain crystals with good flatness. Therefore, with respect to a superlattice strain buffer layer using a layer made of GaN or AlGaN having a low Al content, it is found that the flatness of the superlattice strain buffer layer is deteriorated, variation in a plane of the superlattice structure becomes greater, and thus crystallinity of the layer to be stacked on the superlattice strain buffer layer is degraded.

Therefore, the present inventors have intensively studied for the purpose of developing a nitride semiconductor device having high light output power, in which a superlattice strain buffer layer using AlGaN layers having a low Al content or GaN layers is formed on an AlN template substrate with good flatness, and besides, an n-type nitride semiconductor layer with good flatness and crystallinity is formed on the superlattice strain buffer layer; and for the purpose of developing a method of producing such a device.

Means for Solving the Problem

The present invention is aimed at advantageously solving the above problem of current characteristics. A nitride semiconductor device of the present invention includes a substrate; an AlN strain buffer layer made of AlN formed on the substrate; a superlattice strain buffer layer formed on the AlN strain buffer layer; and a nitride semiconductor layer formed on the superlattice strain buffer layer, and is characterized in that the superlattice strain buffer layer has a superlattice structure formed by alternately stacking first layers made of $Al_xGa_{1-x}N$ ($0 \leq x \leq 0.25$), which further contain p-type impurity, and second layers made of AlN. The AlN strain buffer layer is thus formed between the substrate and the superlattice strain buffer layer, so that generation of dislocation between the substrate and the superlattice strain buffer layer can be suppressed. Besides, generation of warpage (strain) in the nitride semiconductor layer can be suppressed to further reduce the generation of dislocation. Further, if a nitride semiconductor layer is formed on the superlattice strain buffer layer in which p-type impurity is contained in the first layers having a low Al content, when layers serving as a semiconductor device are stacked on the nitride semiconductor layer as a base, a nitride semiconductor device excellent in current characteristics can be obtained. Note that in the present invention, the nitride semiconductor layer is not limited in particular, and may be any given nitride semiconductor layer such as a p-type nitride semiconductor layer, an n-type nitride semiconductor layer, or an i-type nitride semiconductor layer. Further, in the present invention, an i-type nitride semiconductor layer refers to a nitride semiconductor layer which is not intentionally doped with a specific impurity such as Mg or Si (also referred to as an undoped layer). The i-type nitride semiconductor layer is preferably a semiconductor layer ideally containing no impurity; however, any semiconductor layer which does not electrically function as a p-type or n-type is acceptable. Accordingly, in the present invention, a layer having a low charge carrier density (for example, less than $5 \times 10^{16}$ cm$^3$) can be referred to as an i-type layer.

Further, the present invention is aimed at advantageously solve the above problem of light output power. A nitride semiconductor device of the present invention includes a substrate; an AlN strain buffer layer made of AlN formed on the substrate; a superlattice strain buffer layer formed on the AlN strain buffer layer; an n-type nitride semiconductor layer formed on the superlattice strain buffer layer; a light emitting layer formed on the n-type nitride semiconductor layer; a p-type nitride semiconductor layer formed on the light emitting layer; an n-side electrode electrically coupled to the n-type nitride semiconductor layer; and a p-side electrode electrically coupled to the p-type nitride semiconductor layer, and is characterized in that the superlattice strain buffer layer has a superlattice structure formed by alternately stacking first layers made of $Al_xGa_{1-x}N$ ($0 \leq x \leq 0.25$), which further contain p-type impurity, and second layers made of AlN. The AlN strain buffer layer is thus formed between the substrate and the superlattice strain buffer layer, so that generation of dislocation between the substrate and the superlattice strain buffer layer can be suppressed. Besides, generation of warpage (strain) in the n-type nitride semiconductor layer, the light emitting layer, and the p-type nitride semiconductor layer can be suppressed to further reduce the generation of dislocation. Further, when an n-type nitride semiconductor layer is formed on the superlattice strain buffer layer, in which p-type impurity is contained in the first layers having a low Al content, to form a nitride semiconductor device; an n-type nitride semiconductor layer with good flatness and crystallinity can be formed on a flat superlattice strain buffer layer. Thus, a nitride semiconductor device having high light output power can be obtained.

Here, in the nitride semiconductor device of the present invention, the p-type impurity is preferably any one selected from the group consisting of Mg, Zn, Ca, and Be, more preferably Mg or Zn, and particularly preferably Mg. In view of the segregation effect on nitride semiconductors, Mg, Zn, Ca, or Be can be used as a p-type impurity. Mg or Zn is suitable as a lateral direction crystal growth promoting substance for promoting crystal growth of AlGaN or GaN in a lateral direction. Among those, Mg is particularly suitable as a lateral direction crystal growth promoting substance because it is less likely to diffuse into another layer. Note that in the present invention, not Si (n-type impurity), C, or the like by which crystal growth is promoted in three dimensions due to the anti-surfactant effect but Mg or the like (p-type impurity) by which crystal growth is promoted in a lateral direction is contained in the first layers. Thus, the n-type nitride semiconductor layer with good flatness and crystallinity can be formed on the flat superlattice strain buffer layer. Further, in the present invention, the term "p-type impurity" is used; however, in the nitride semiconductor device of the present invention, whether the above impurity is active or not is not important, and the impurity may be inactive.

Further, in the nitride semiconductor device of the present invention, the thickness of each first layer is preferably 0.1 nm to 3 nm. As the thickness of layers forming the superlattice strain buffer layer is small, the light output power of the nitride semiconductor device increases. Under such circumstances, when the thickness of each first layer is 3 nm or less, more preferably 2 nm or less, a nitride semiconductor device with high light output power can be obtained. In addition, as the thickness of layers forming the superlattice strain buffer layer is small, current characteristics of the nitride semiconductor device are improved. On the other hand, it is difficult to form and control layers having a thickness less than 0.1 nm.

Further, in the nitride semiconductor device of the present invention, the concentration of the p-type impurity in the first layers is preferably $5 \times 10^{16}$ cm$^{-3}$ or more and less than $2 \times 10^{19}$ cm$^{-3}$, more preferably $7 \times 10^{17}$ cm$^{-3}$ to $1.7 \times 10^{19}$ cm$^{-3}$. When the p-type impurity concentration is $5 \times 10^{16}$ cm$^{-3}$ or more, the flatness of the superlattice strain buffer layer can be improved to form the nitride semiconductor layer or the n-type nitride semiconductor layer with good flatness and crystallinity. Meanwhile, when the p-type impurity concentration is $2 \times 10^{19}$ cm$^{-3}$ or more, condensation of the impurity occurs to deteriorate crystallinity of the superlattice strain buffer layer, which adversely affects the flatness and crystallinity of the nitride semiconductor layer or the n-type nitride semiconductor layer to be stacked subsequently. Note that in the present invention, a p-type impurity concentration refers to a value measured by SIMS.

Here, a method of producing a nitride semiconductor device according to the present invention includes the steps of forming an AlN strain buffer layer made of AlN on a substrate; forming a superlattice strain buffer layer on the AlN strain buffer layer; and forming a nitride semiconductor layer on the superlattice strain buffer layer, and is characterized in that the step of forming the superlattice strain buffer layer is a step of forming a superlattice structure by alternately stacking first layers made of $Al_xGa_{1-x}N$ ($0 \leq x \leq 0.25$), which further contain p-type impurity, and second layers made of AlN. The AlN strain buffer layer is thus formed between the substrate and the superlattice strain buffer layer, so that generation of dislocation between the substrate and the superlattice strain buffer layer can be suppressed. Besides, generation of warpage (strain) in the nitride semiconductor layer can be suppressed to further reduce the generation of dislocation. Further, if a superlattice strain buffer layer is formed with p-type impurity contained in the first layers having a low Al content, and besides a nitride semiconductor layer is formed on the superlattice strain buffer layer to form a nitride semiconductor device, layers serving as a semiconductor device are stacked on the nitride semiconductor layer as a base, so that a nitride semiconductor device excellent in current characteristics can be obtained. Note that in the present invention, the nitride semiconductor layer is not limited in particular, and may be any given nitride semiconductor layer such as a p-type nitride semiconductor layer, an n-type nitride semiconductor layer, or an i-type nitride semiconductor layer. Further, in the present invention, an i-type nitride semiconductor layer refers to a nitride semiconductor layer which is not intentionally doped with a specific impurity such as Mg or Si (also referred to as an undoped layer). The i-type nitride semiconductor layer is preferably a semiconductor layer ideally containing no impurity; however, any semiconductor layer which does not electrically function as a p-type or n-type is acceptable. Accordingly, in the present invention, a layer having a low charge carrier density (for example, less than $5 \times 10^{16}/cm^3$) can be referred to as an i-type layer.

Further, a method of producing a nitride semiconductor device according to the present invention preferably includes the steps of forming an AlN strain buffer layer made of AlN on a substrate; forming a superlattice strain buffer layer on the AlN strain buffer layer; forming an n-type nitride semiconductor layer on the superlattice strain buffer layer; forming a light emitting layer on the n-type nitride semiconductor layer; forming a p-type nitride semiconductor layer on the light emitting layer; forming an n-side electrode electrically coupled to the n-type nitride semiconductor layer; and forming a p-side electrode electrically coupled to the p-type nitride semiconductor layer, and is characterized in that the step of forming the superlattice strain buffer layer is a step of forming a superlattice structure by alternately stacking first layers made of $Al_xGa_{1-x}N$ ($0 \leq x \leq 0.25$), which further contain p-type impurity, and second layers made of AlN. The AlN strain buffer layer is thus formed between the substrate and the superlattice strain buffer layer, so that generation of dislocation between the substrate and the superlattice strain buffer layer can be suppressed. Besides, generation of warpage (strain) in the n-type nitride semiconductor layer, the light emitting layer, and the p-type nitride semiconductor layer can be suppressed to further reduce the generation of dislocation. Further, when a superlattice strain buffer layer is formed with p-type impurity contained in the first layers having a low Al content and the n-type nitride semiconductor layer is formed on the superlattice strain buffer layer to form a nitride semiconductor device, an n-type nitride semiconductor layer with good flatness and crystallinity can be formed on a flat superlattice strain buffer layer. Thus, a nitride semiconductor device having high light output power can be obtained.

Here, in the method of producing a nitride semiconductor device according to the present invention, the step of forming the n-side electrode preferably includes, after forming the p-type nitride semiconductor layer on the light emitting layer, exposing a part of the n-type nitride semiconductor layer on the light emitting layer side, and forming the n-side electrode on the exposed part.

Further, in the method of producing a nitride semiconductor device according to the present invention, the p-type impurity is preferably any one selected from the group consisting of Mg, Zn, Ca, and Be, more preferably Mg or Zn, and particularly preferably Mg. In view of the segregation effect on nitride semiconductors, Mg, Zn, Ca, or Be can be used as a p-type impurity. Mg or Zn is suitable as a lateral direction crystal growth promoting substance for promoting crystal growth of AlGaN or GaN in a lateral direction. Among those, Mg is particularly suitable as a lateral direction crystal growth promoting substance because it is less likely to diffuse into another layer. Note that in the present invention, not Si (n-type impurity), C, or the like by which crystal growth is promoted in three dimensions due to the anti-surfactant effect but Mg or the like (p-type impurity) by which crystal growth is promoted in a lateral direction is contained in the first layers. Thus, the n-type nitride semiconductor layer with good flatness and crystallinity can be formed on the flat superlattice strain buffer layer. Further, in the present invention, the term "p-type impurity" is used; however, in the nitride semiconductor device of the present invention, whether the above impurity is active or not is not important, and the impurity may be inactive.

Further, in the method of producing a nitride semiconductor device according to the present invention, the thickness of each first layer is preferably 0.1 nm to 3 nm. As the thickness of layers forming the superlattice strain buffer layer is small, the light output power of the nitride semiconductor device increases. Under such circumstances, when the thickness of each first layer is 3 nm or less, more preferably 2 nm or less, a nitride semiconductor device with high light output power can be obtained. In addition, as the thickness of layers forming the superlattice strain buffer layer is small, current characteristics of the nitride semiconductor device are improved. On the other hand, it is difficult to form and control layers having a thickness less than 0.1 nm.

Further, in the method of producing a nitride semiconductor device according to the present invention, the concentration of the p-type impurity in the first layers is preferably $5 \times 10^{16}$ cm$^{-3}$ or more and less than $2 \times 10^{19}$ cm$^{-3}$. When the p-type impurity concentration is $5 \times 10^{16}$ cm$^{-3}$ or more, the flatness of the superlattice strain buffer layer can be improved to form the nitride semiconductor layer or the n-type nitride semiconductor layer with good flatness and crystallinity. Meanwhile, when the p-type impurity concentration is $2 \times 10^{19}$ cm$^{-3}$ or more, condensation of the impurity occurs to deteriorate crystallinity of the superlattice strain buffer layer, which adversely affects the flatness and crystallinity of the nitride semiconductor layer or the n-type nitride semiconductor layer to be stacked subsequently. Note that in the present invention, a p-type impurity concentration refers to a value measured by SIMS.

Effect of the Invention

The present invention can provide a nitride semiconductor device excellent in current characteristics, in which a superlattice strain buffer layer using AlGaN layers having a low Al content or GaN layers is formed with good flatness on an AlN strain buffer layer on a substrate, and a nitride semiconductor layer with good flatness and crystallinity is formed on the superlattice strain buffer layer.

Further, the present invention can provide a nitride semiconductor device having high light output power, in which a superlattice strain buffer layer using AlGaN layers having a low Al content or GaN layers is formed with good flatness on an AlN strain buffer layer on a substrate, and an n-type nitride semiconductor layer with good flatness and crystallinity is formed on the superlattice strain buffer layer.

BRIEF DESCRIPTION OF THE DRAWINGS

The patent or application file contains at least one drawing executed in color. Copies of this patent application publication with color drawing(s) will be provided by the Office upon request and payment of the necessary fee.

BEST MODE FOR CARRYING OUT THE INVENTION

Embodiments of the present invention will be described below in detail with reference to the drawings. Here, an example of a nitride semiconductor device according to the present invention is, as its cross section schematically shown in FIG. 1, a nitride semiconductor device 10 including a substrate 1, an AlN strain buffer layer 2 formed on the substrate 1; a superlattice strain buffer layer 3 formed on the AlN strain buffer layer 2; an n-type nitride semiconductor layer 4 formed on the superlattice strain buffer layer 3; a light emitting layer 5 formed on the n-type nitride semiconductor layer 4; a p-type nitride semiconductor layer 6 formed on the light emitting layer 5; an n-side electrode 7 electrically coupled to the n-type nitride semiconductor layer 4; and a p-side electrode 8 electrically coupled to the p-type nitride semiconductor layer 6. The superlattice strain buffer layer 3 of this nitride semiconductor device 10 has a superlattice structure formed by alternately stacking first layers 31 made of $Al_xGa_{1-x}N$ ($0 \leq x \leq 0.25$), which further contain p-type impurity, and second layers 32 made of AlN. Note that in FIG. 1, the lamination structure of the superlattice strain buffer layer 3 is partially omitted.

Figure 1:
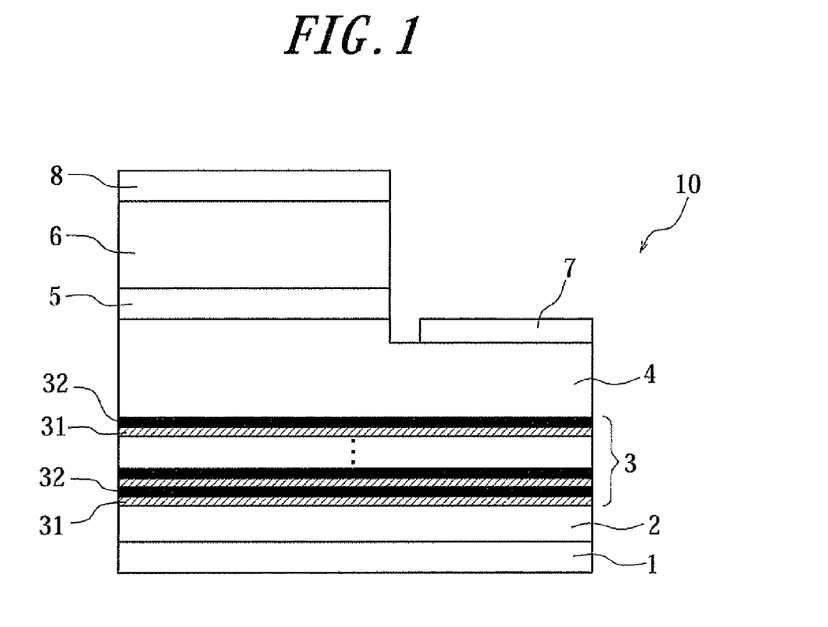
FIG. 1 is a cross-sectional view schematically illustrating an example of a nitride semiconductor device according to the present invention.

Here, as the substrate 1, for example, a sapphire substrate, a silicon carbide (SiC) substrate, a silicon (Si) substrate, a germanium (Ge) substrate, a gallium nitride (GaN) substrate, an aluminum gallium nitride (AlGaN) substrate, an aluminum nitride (AlN) substrate, or the like can be used.

As the AlN strain buffer layer 2, a layer made of AlN having a thickness of, for example, 20 nm to 1500 nm, preferably 500 nm to 1500 nm, more preferably 800 nm to 1000 nm can be used and the layer is epitaxially grown on the substrate 1 by a known technique such as MOCVD, MOVPE, HVPE, or MBE.

The superlattice strain buffer layer 3 may have a superlattice structure in which the first layers 31 and the second layers 32 are alternately epitaxially grown by a known technique. Note that the thickness of each layer in the first layers 31 is for example, 0.1 nm to 3 nm, preferably 2 nm or less, and the thickness of each layer in the second layers 32 is for example, 0.1 nm to 9 nm, preferably 0.9 nm to 9 nm at the time of alternately stacking the first layers 31 and the second layers 32 to form the superlattice structure. Further, the lamination number of the first layers 31 and the second layers 32 may be, for example, 20 to 70 sets each including one of the first layers 31 and one of the second layers 32, preferably 20 to 50 sets. With such a lamination number, generation of dislocation can be suppressed sufficiently.

Note that in the superlattice strain buffer layer 3, the second layers made of AlN is thicker (the ratio of the second layers is higher) on the AlN strain buffer layer 2 side, and the ratio of the second layers with respect to the first layers preferably decreases gradually to the side of the n-type nitride semiconductor layer 4. With such a structure, the crystallinity of the n-type nitride semiconductor layer 4 can be improved further.

Further, the superlattice strain buffer layer 3 is not substantially electrically conductive as a whole (for example, the resistivity measured by a sheet resistance measuring apparatus is 10 Ω·cm/square or more), and the impurity concentration in the superlattice strain buffer layer 3 as a whole measured by SIMS is preferably $1 \times 10^{18}$ cm$^{-3}$ or less, more preferably $7 \times 10^{17}$ cm$^{-3}$ or less. When the impurity concentration is more than $1 \times 10^{18}$ cm$^{-3}$, thyristor failure would occur in the nitride semiconductor device.

In general, doping of p-type impurity into an AlN layer is difficult and involves deterioration of crystallinity. In contrast, since the superlattice strain buffer layer of the present invention is not required to be electrically conductive, the amount of impurities in the second layers 32 is preferably much smaller than the normal impurity doping amount, except for unavoidable impurity diffusion from the first layers 31.

Here, as the first layers 31, a layer having a low Al content, which is made of $Al_xGa_{1-x}N$ ($0 \leq x \leq 0.25$), preferably $Al_xGa_{1-x}N$ ($0 \leq x \leq 0.23$) which further contains p-type impurity can be used. Note that, as the p-type impurity, for example Mg, Zn, Ca, or Be can be used. The p-type impurity is supplied into the first layers 31 by simultaneously providing the p-type impurity in a source gas of the first layers 31, and/or, intermittently the p-type impurity is supplied onto the AlN strain buffer layer 2 or the second layer 32 and then the first layers 31 are formed to diffuse the p-type impurity into the first layers 31. Thus, the p-type impurity can be contained in the first layers 31. Further, the concentration of the p-type impurity in the first layers 31 may be for example, $5 \times 10^{16}$ cm$^{-3}$ or more and less than $2 \times 10^{19}$ cm$^{-3}$, preferably $7 \times 10^{17}$ cm$^{-3}$ to $1.7 \times 10^{19}$ cm$^{-3}$, more preferably $7 \times 10^{18}$ cm$^{-3}$ to $1.7 \times 10^{19}$ cm$^{-3}$.

Note that for such cases where, for example, the AlN strain buffer layer 2 and the superlattice strain buffer layer 3 are stacked on the substrate 1 with oxygen attached thereto, oxygen (O) would be mixed into the first layers 31 by diffusion or the like. Such oxygen would be a cause of reduction in the light output power of the nitride semiconductor device 10; therefore, the concentration of oxygen in the first layers 31 is preferably $1 \times 10^{18}$ cm$^{-3}$ or less.

As the n-type nitride semiconductor layer 4, a layer made of $Al_cGa_{1-c}N$ (where $0 \leq c \leq 1$) doped with Si or the like can be used. As the light emitting layer 5, a layer made of $Al_dIn_eGa_{1-d-e}N$ (where $0 \leq d \leq 1$, $0 \leq e \leq 1$, $0 \leq d+e \leq 1$) can be used. As the p-type nitride semiconductor layer 6, a layer made of Al$_f$Ga$_{1-f}$N (where 0≤f≤1) doped with Mg, Zn, Ca, or Be can be used. Further, the thickness of the layers may be, for example, as follows: the n-type nitride semiconductor layer 4: 1300 nm to 1400 nm, the light emitting layer 5: 50 nm to 80 nm, and the p-type nitride semiconductor layer 6: 200 nm to 300 nm. Note that these layers can be formed by epitaxial growth using a known technique.

Further, as the n-side electrode 7, for example, a Ti/Al electrode formed by sequentially vapor-depositing a Ti-containing film and an Al-containing film by vacuum vapor deposition can be used. Meanwhile, as the p-side electrode 8, for example, a Ni/Au electrode formed by sequentially vapor-depositing a Ni-containing film and an Au-containing film by vacuum vapor deposition can be used.

Then, the nitride semiconductor device 10 can be produced, for example as follows.

Figure 2:
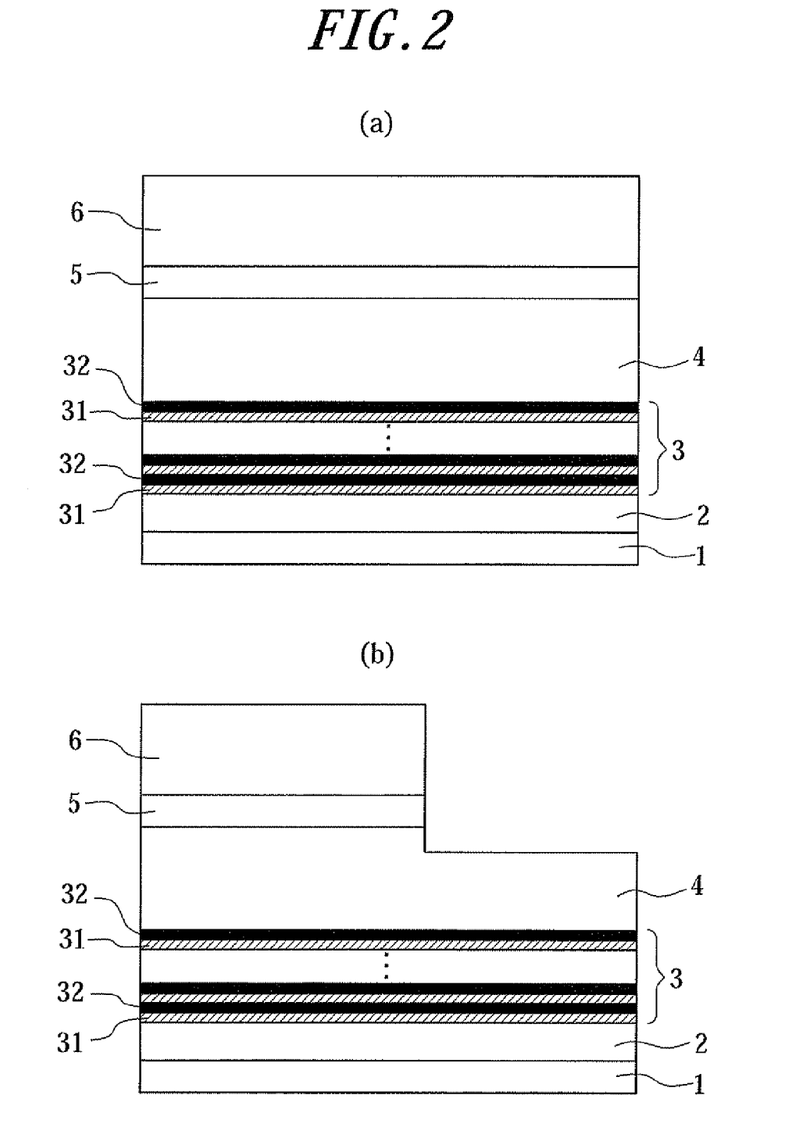
FIGS. 2(a) and 2(b) are illustrations showing an example of a method of producing a nitride semiconductor device according to the present invention.

First, as shown in FIG. 2(a), an AlN strain buffer layer 2, a superlattice strain buffer layer 3, an n-type nitride semiconductor layer 4, a light emitting layer 5, and a p-type nitride semiconductor layer 6 are sequentially epitaxially grown on a substrate 1, for example, by MOCVD to form an epitaxial laminate. Next, as shown in FIG. 2(b), the n-type nitride semiconductor layer 4, the light emitting layer 5, and the p-type nitride semiconductor layer 6 are partially etched by dry etching to partially expose the n-type nitride semiconductor layer 4 on the light emitting layer 5 side (the upper side in FIG. 2(b)). Finally, an n-side electrode 7 and a p-side electrode 8 are formed by vacuum vapor deposition to be electrically coupled to the n-type nitride semiconductor layer 4 and the p-type nitride semiconductor layer 6 respectively, thereby completing a nitride semiconductor device 10 as shown in FIG. 1.

In the thus produced nitride semiconductor device 10, with respect to first layers 31 and second layers 32 forming the superlattice strain buffer layer 3, since p-type impurity is contained in layers having a low Al content (first layers 31), crystal growth of the first layers 31 in a lateral direction is promoted to improve flatness of the superlattice strain buffer layer 3. Therefore, flatness and crystallinity of the n-type nitride semiconductor layer 4 formed on the superlattice strain buffer layer 3 is improved, and crystallinity of the light emitting layer 5 and the p-type nitride semiconductor layer 6 thereon is also improved accordingly. Thus, the nitride semiconductor device 10 having high light output power can be obtained.

Note that with regard to a nitride semiconductor device of the present invention, when an AlN template substrate having an AlN strain buffer layer is employed and an epitaxial growth layer is formed thereon, an AlN layer may be formed as an initial layer between the superlattice strain buffer layer and the AlN template substrate. Further, an n-type nitride semiconductor layer and a p-type nitride semiconductor layer in a nitride semiconductor device of the present invention may each be a laminate. Specifically, a laminate of an n-cladding layer and an n-contact layer or a laminate of a p-cladding layer and a p-contact layer may be used. Further, the AlN strain buffer layer formed on the substrate may be, for example, a strain buffer layer using a nitride semiconductor layer made of another nitride semiconductor such as GaN or AlGaN.

The nitride semiconductor device of the present invention has been described above taking an example of a nitride semiconductor light emitting device. However, nitride semiconductor devices according to the present invention are not limited to the nitride semiconductor light emitting device of the one example above.

Figure 3:
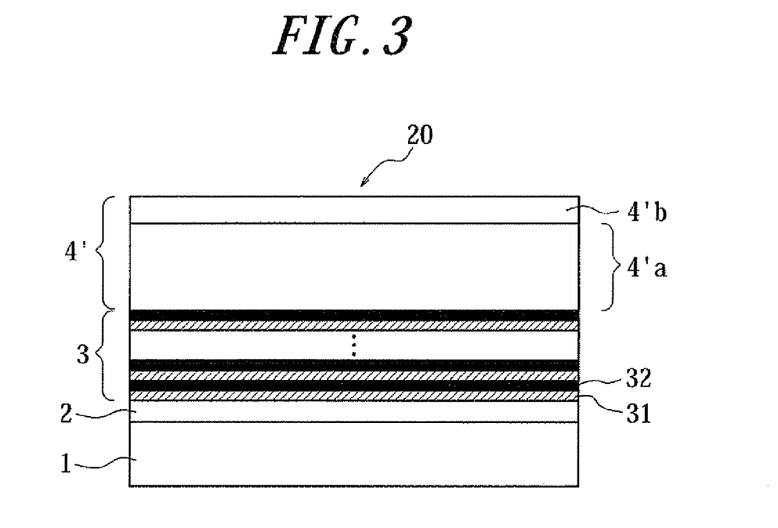
FIG. 3 is a cross-sectional view schematically illustrating another example of a nitride semiconductor device according to the present invention.

Specifically, another example of nitride semiconductor devices of the present invention is, as its cross section schematically shown in FIG. 3, a nitride semiconductor device 20 including a substrate 1, an AlN strain buffer layer 2 formed on the substrate 1, a superlattice strain buffer layer 3 formed on the AlN strain buffer layer 2, and a nitride semiconductor layer 4' formed on the superlattice strain buffer layer 3. The superlattice strain buffer layer 3 of this nitride semiconductor device 20 has a superlattice structure formed by alternately stacking first layers 31 made of Al$_x$Ga$_{1-x}$N (0≤x≤0.25) which further contains p-type impurity and second layers 32 made of AlN. This nitride semiconductor device 20 can be used, for example, for electronic devices such as HEMTs. Note that the lamination structure of the superlattice strain buffer layer 3 is partially omitted in FIG. 3. Further, in FIG. 3, components having a structure the same as the nitride semiconductor device of FIG. 1 are denoted by the same reference numerals.

Here, the substrate 1, the AlN strain buffer layer 2, and the superlattice strain buffer layer 3 of this nitride semiconductor device 20 may have similar structures and compositions to the preceding example.

The nitride semiconductor layer 4' is formed by epitaxially growing a plurality of III-nitride layers and may have a channel layer 4'a made of a B$_{a1}$Al$_{b1}$Ga$_{c1}$In$_{d1}$N (0≤a1≤1, 0<b1≤1, 0≤c1≤1, 0≤d1≤1, a1+b1+c1+d1=1) material and an electron supply layer 4'b made of a B$_{a2}$Al$_{b2}$Ga$_{c2}$In$_{d2}$N (0≤a2≤1, 0<b2≤1, 0≤c2≤1, 0≤d2≤1, a2+b2+c2+d2=1) material having a larger bandgap than the bandgap of the channel layer 4'a. Note that both the channel layer 4'a and the electron supply layer 4'b can be formed from a single or a plurality of compositions. Further, in order to prevent alloy scattering and to decrease resistivity at the current flowing portion, at least a part of the channel layer 4'a in contact with the electron supply layer 4'b is preferably made of a GaN material. When this nitride semiconductor device 20 is used for HEMTs, HEMTs can be formed by providing a source electrode, a drain electrode, and a gate electrode on a surface of the electron supply layer 4'b.

The nitride semiconductor device 20 may be produced by forming an epitaxial laminate by sequentially epitaxially growing an AlN strain buffer layer 2, a superlattice strain buffer layer 3, and a nitride semiconductor layer 4' on a substrate 1 such as a Si substrate using MOCVD, for example.

In the thus produced nitride semiconductor device 20, with respect to first layers 31 and second layers 32 forming the superlattice strain buffer layer 3, since p-type impurity is contained in layers having a low Al content (first layers 31), crystal growth of the first layers 31 in a lateral direction is promoted to improve flatness of the superlattice strain buffer layer 3. Therefore, flatness and crystallinity of the nitride semiconductor layer 4' formed on the superlattice strain buffer layer 3 is improved. Thus, the nitride semiconductor device 20 excellent in current characteristics can be obtained.

Note that with regard to a nitride semiconductor device of the present invention, when an AlN template substrate having an AlN strain buffer layer is employed and an epitaxial growth layer is formed thereon, an AlN layer may be formed as an initial layer between the superlattice strain buffer layer and the AlN template substrate. Further, a nitride semiconductor device of the present invention may have any given structure and composition in accordance with the application.

EXAMPLE

The present invention will be described below in more detail using Examples; however, the present invention is not limited to the following Examples. Note that the Al compositions mentioned in Examples and Comparative Examples below correspond to the values measured at the substrate centers.

Example 1

An AlN layer (thickness: 27 nm) was formed as an initial layer by MOCVD on an AlN template having an AlN strain buffer layer on the (0001) plane of a sapphire substrate, and then a superlattice strain buffer layer, an n-type nitride semiconductor layer, a light emitting layer, and a p-type nitride semiconductor layer were epitaxially grown thereon sequentially to form an epitaxial laminate. After that, the n-type nitride semiconductor layer was partially exposed by dry etching. An n-side electrode (Ti/Al) was formed on the n-type nitride semiconductor layer, and a p-side electrode (Ni/Au) was formed on the p-type nitride semiconductor layer to manufacture a nitride semiconductor device. Note that the thickness of the AlN strain buffer layer used was 800 nm, and its dislocation density was $1 \times 10^{10}$ cm$^{-2}$ or less. Note that the superlattice strain buffer layer had a structure in which first layers were made of GaN and a superlattice layer I having 20 sets of alternately stacked AlN layers (thickness: 9 nm) and GaN layers (thickness: 2.1 nm), a superlattice layer II having 30 sets of alternately stacked AlN layers (thickness: 2.7 nm) and GaN layers (thickness: 2.1 nm), and a superlattice layer III having 50 sets of alternately stacked AlN layers (thickness: 0.9 nm) and GaN layers (thickness: 2.1 nm) were sequentially stacked. The GaN layers (first layers) were doped with Mg. In addition, the structure of the obtained nitride semiconductor device is shown in Table 1, and the manufacturing conditions for the superlattice strain buffer layer and the AlN initial layer are shown in Table 2.

Note that in order to measure the resistivity of the superlattice strain buffer layer in Example 1, the resistivity of a sample at a stage where a superlattice strain buffer layer has been made was measured by a sheet resistance measuring apparatus, and the resistivity was 15.2 Ω·cm/square.

TABLE 2

| Device structure | | Al composition (value of x) | TMG (sccm) | TMA (sccm) | NH$_3$ (slm) | Cp$_2$Mg (sccm) |
|---|---|---|---|---|---|---|
| Super- | Superlattice | 0 | 20 | — | 10 | 25 |
| lattice | layer III | 1 | — | 10 | 0.5 | — |
| strain | Superlattice | 0 | 20 | — | 10 | 25 |
| buffer | layer II | 1 | — | 10 | 0.5 | — |
| layer | Superlattice | 0 | 20 | — | 10 | 25 |
| | layer I | 1 | — | 10 | 0.5 | — |
| AlN initial layer | | 1 | — | 10 | 0.5 | — |

Comparative Example 1

A nitride semiconductor device was manufactured in a similar manner to Example 1 except for that GaN layers in a superlattice strain buffer layer were not doped with Mg.

Example 2-1

A nitride semiconductor device was manufactured in a similar manner to Example 1 except for that first layers in a superlattice strain buffer layer were made of Al$_x$Ga$_{1-x}$N (x=0.15) instead of GaN.

Comparative Example 2-1

A nitride semiconductor device was manufactured in a similar manner to Example 2-1 except for that Al$_x$Ga$_{1-x}$N (x=0.15) layers in a superlattice strain buffer layer were not doped with Mg.

Example 2-2

A nitride semiconductor device was manufactured in a similar manner to Example 1 except for that first layers in a superlattice strain buffer layer were made of Al$_x$Ga$_{1-x}$N (x=0.23) instead of GaN.

TABLE 1

| Device structure | | Al composition (value of x) | Lamination number (sets) | Thickness per layer (nm) | Total thickness (nm) |
|---|---|---|---|---|---|
| p-type | p-contact layer | 0 | 1 | 20 | 20 |
| nitride | p-cladding layer | 0.22 | 1 | 160 | 160 |
| semiconductor | p-guide layer | 0.22 | 1 | 60 | 60 |
| layer | p-block layer | 0.43 | 1 | 10 | 10 |
| | i-guide layer | 0.17 | 1 | 10 | 10 |
| Light | Well layer | 0.15 | 5 | 3 | 15 |
| emitting | i-barrier layer | 0.17 | | 3.3 | 16.5 |
| layer | n-barrier layer | 0.17 | | 3.3 | 16.5 |
| | i-barrier layer | 0.17 | | 3.3 | 16.5 |
| n-type | n-guide layer | 0.2 | 1 | 60 | 60 |
| nitride | n-cladding layer | 0.23 | 1 | 300 | 300 |
| semiconductor | n-contact layer | 0.23 | 1 | 1000 | 1000 |
| layer | i-surface layer | 0.23 | 1 | 200 | 200 |
| Superlattice | Superlattice | 0 | 50 | 2.1 | 105 |
| strain | layer I | 1 | | 0.9 | 45 |
| buffer | Superlattice | 0 | 30 | 2.1 | 63 |
| layer | layer II | 1 | | 2.7 | 81 |
| | Superlattice | 0 | 20 | 2.1 | 42 |
| | layer III | 1 | | 9 | 180 |
| AlN initial layer | | 1 | 1 | 27 | 27 |

Comparative Example 2-2

A nitride semiconductor device was manufactured in a similar manner to Example 2-2 except for that $Al_xGa_{1-x}N$ (x=0.23) layers in a superlattice strain buffer layer were not doped with Mg.

Comparative Example 3

First layers in a superlattice strain buffer layer were made of $Al_xGa_{1-x}N$ (x=0.43), and the similar operations to Example 2-1 were performed up to the formation of an epitaxial laminate. The light output power was not examined.

Comparative Example 4

An epitaxial laminate was formed in a similar manner to Comparative Example 3 except for that $Al_xGa_{1-x}N$ (x=0.43) layers in a superlattice strain buffer layer were not doped with Mg.

Evaluation of Flatness of Superlattice Strain Buffer Layer

Figure 4:
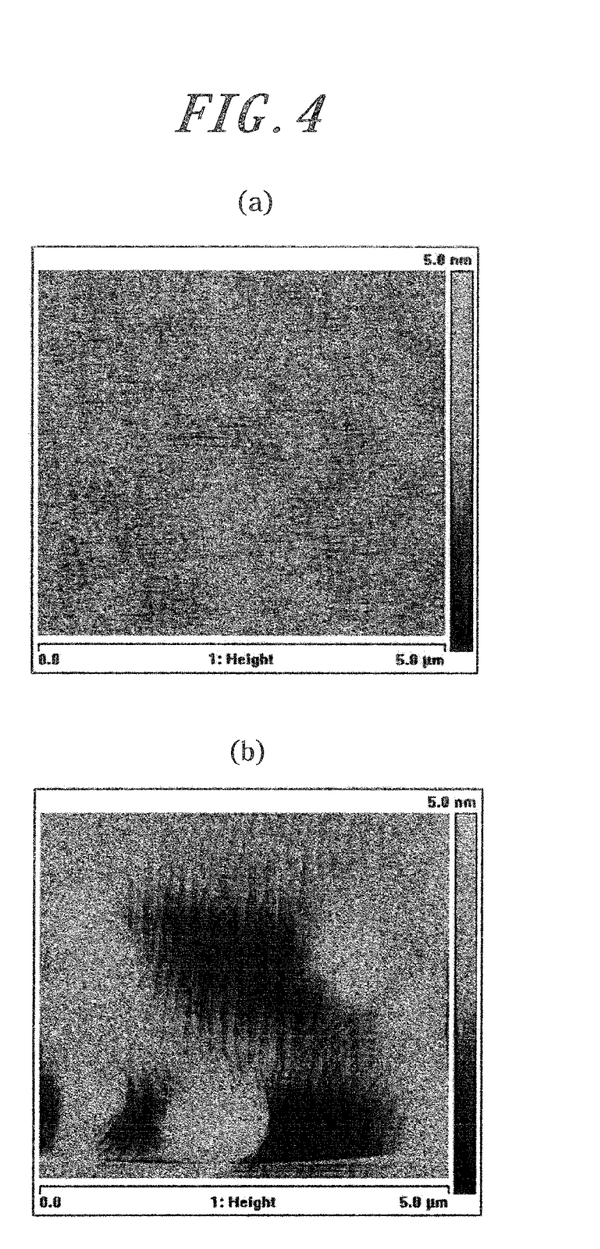
FIG. 4(a) shows an AFM image of the top surface of a superlattice strain buffer layer in a nitride semiconductor device of an example of the present invention.
FIG. 4(b) shows an AFM image of the top surface of a superlattice strain buffer layer in a nitride semiconductor device of a comparative example of the present invention.

With respect to Examples 1, 2-1, and 2-2 and Comparative Examples 1, 2-1, 2-2, 3, and 4, the surface of the superlattice strain buffer layer in each sample at a stage where the superlattice strain buffer layer had been formed was observed using an atomic force microscope (AFM) to find the surface roughness Ra of each n-type nitride semiconductor layer. The results are shown in Table 3. Further, with respect to Example 1 and Comparative Example 1, the conditions of the top surfaces of the superlattice strain buffer layers are shown in FIGS. 4(a) and 4(b), respectively.

Evaluation of Crystallinity of n-Type Nitride Semiconductor Layer

With respect to Examples 1, 2-1, and 2-2 and Comparative Examples 1, 2-1, 2-2, 3, and 4, each sample at a stage where the epitaxial laminate had been formed was analyzed by an X-ray diffractometer to find half widths of the peaks corresponding to the (002) plane and (102) plane of the crystals forming the n-type nitride semiconductor layer, the light emitting layer, and the p-type nitride semiconductor layer. The results are shown in Table 3. Note that the smaller the half width is, the better the crystallinity is. In particular, since the (102) plane easily affects the light emitting layer, the half width of the peak corresponding to the (102) plane is preferably small.

Evaluation of Light Output Power of Nitride Semiconductor Device

In Examples 1, 2-1, and 2-2 and Comparative Examples 1, 2-1, and 2-2, at a stage where the epitaxial laminate had been formed, the growth surface was scribed with a diamond pen; Indium dots were physically pressed on a point where the n-type nitride semiconductor layer was exposed and a point 1.5 mm apart from the exposed point. Thus, a simple nitride semiconductor device using the formed two points as an n-type electrode and a p-type electrode was manufactured. Then, probes were put on those points, light after current application was output from the rear surface, and the light was guided to a multi-channel spectrometer through an optical fiber. The peak intensity of the spectrum was converted to W (watts) to obtain the light output power Po. The results are shown in Table 3.

TABLE 3

| | Conditions for First layers | | Surface roughness | Half width (second) | | Po |
|---|---|---|---|---|---|---|
| | Mg doping | value of x | Ra (nm) | (002) plane | (102) plane | (μW) |
| Example 1 | Doped | 0 | 0.21 | 268 | 482 | 178.8 |
| Comparative Example 1 | Undoped | 0 | 0.49 | 329 | 611 | 10.6 |
| Example 2-1 | Doped | 0.15 | 0.26 | 310 | 512 | 168.2 |
| Comparative Example 2-1 | Undoped | 0.15 | 0.52 | 253 | 581 | 30.7 |
| Example 2-2 | Doped | 0.23 | 0.40 | 426 | 549 | 45.1 |
| Comparative Example 2-2 | Undoped | 0.23 | 0.53 | 232 | 553 | 44.8 |
| Comparative Example 3 | Doped | 0.43 | 2.63 | 273 | 3474 | — |
| Comparative Example 4 | Undoped | 0.43 | 0.79 | 290 | 1614 | — |

Table 3 shows that the flatness and crystallinity of the n-type nitride semiconductor layer in Examples 1, 2-1, and 2-2 where the GaN layers in the superlattice strain buffer layer had been doped with Mg were improved, and accordingly the light output power of the nitride semiconductor devices were improved significantly.

Further, it is shown that the effects of improving the flatness and crystallinity by doping the first layers with Mg and improving the power output were greater when the Al composition of the first layer was x=0; on the other hand, they were rather worse with x=0.43. Therefore, the composition of $Al_xGa_{1-x}N$ forming the first layers is set to satisfy 0≤x≤0.25, preferably 0≤x≤0.15.

Figure 7:
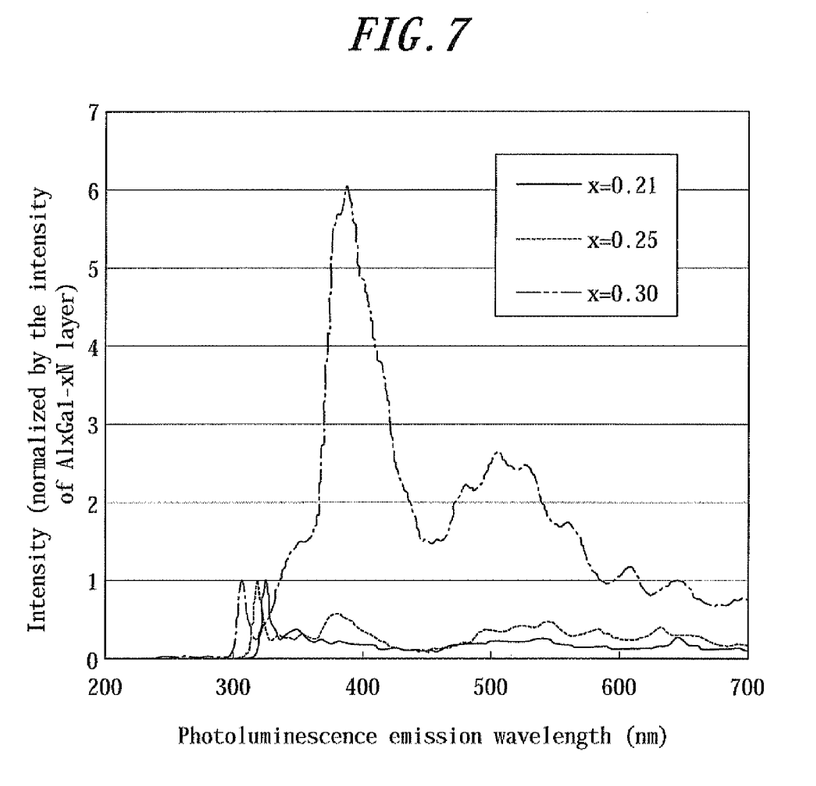
FIG. 7 is a graph showing the relationship between the photoluminescence emission wavelength and intensity of $Al_xGa_{1-x}N$ crystals.

Note that as the value x exceeds 0.25, more defects are introduced, and the value of crystallinity is also degraded significantly. FIG. 7 shows the results of evaluating photoluminescence in $Al_xGa_{1-x}N$. The measurement was performed on the wafer center by generating a laser of 244 nm with the use of Ar laser and an SHG crystal. The evaluation makes it possible to determine the value x in $Al_xGa_{1-x}N$ and fluctuations in the amount of defects in the crystals. Bowing parameters described in Yun F. et al, J. Appl. Phys. 92, 4837(2002) were used for the conversion from the emission wavelength of the photoluminescence to the value x (Al composition).

Specific $Al_xGa_{1-x}N$ was grown, and as to x=0.21, 0.25, 0.30, the intensity was normalized by the peak (peak observed at the shortest wavelength) intensity in $Al_xGa_{1-x}N$ with respect to the photoluminescence emission wavelength. As a result, as to x=0.21, there seems no particularly high peak on the long wavelength side. Peaks seen on the long wavelength side show that there are energy levels different from the band gap of $Al_xGa_{1-x}N$, which indicates that defects, particularly, point defects are introduced in crystals. Accordingly, it is shown that $Al_{0.21}Ga_{0.79}N$ had less crystal defects. On the other hand, with respect to $Al_{0.25}Ga_{0.75}N$ where x=0.25, a peak is emerging in the vicinity of 380 nm. Further, with respect to $Al_{0.30}Ga_{0.70}N$ where x=0.30, a peak due to defects, which has a peak intensity approximately six times higher than that of $Al_{0.30}Ga_{0.70}N$ at maximum emerged. In view of this as well, when x=0.43, defects were rapidly introduced into $Al_xGa_{1-N}$ crystals, and as a result, half width values measured by x-ray measurement are also considered to have been rapidly deteriorated.

Example 3

A nitride semiconductor device was manufactured in a similar manner to Example 1 except for that the flow rate of Mg gas in forming GaN layers of a superlattice strain buffer layer was doubled. The flatness of the superlattice strain buffer layer, the crystallinity of an epitaxial laminate, and light power output of the nitride semiconductor device were evaluated in a similar manner to Example 1. The results are shown in Table 4.

TABLE 4

| | GaN layer film forming conditions | Surface | Half width (second) | | |
|---|---|---|---|---|---|
| | $Cp_2Mg$ flow rate (sccm) | roughness Ra (nm) | (002) plane | (102) plane | Po (mW) |
| Example 1 | 25 | 0.21 | 268 | 482 | 178.8 |
| Comparative Example 1 | — | 0.49 | 329 | 611 | 10.6 |
| Example 3 | 50 | 0.40 | 253 | 513 | 58.3 |

From the results in Table 4, Example 3 with a great amount of Mg showed improvement in crystallinity as compared with Comparative Example 1 without Mg doping; however, less advantageous effects were achieved as compared with Example 1. This indicates that there is an appropriate range for the Mg doping amount.

Reference Example 1

Figure 5:
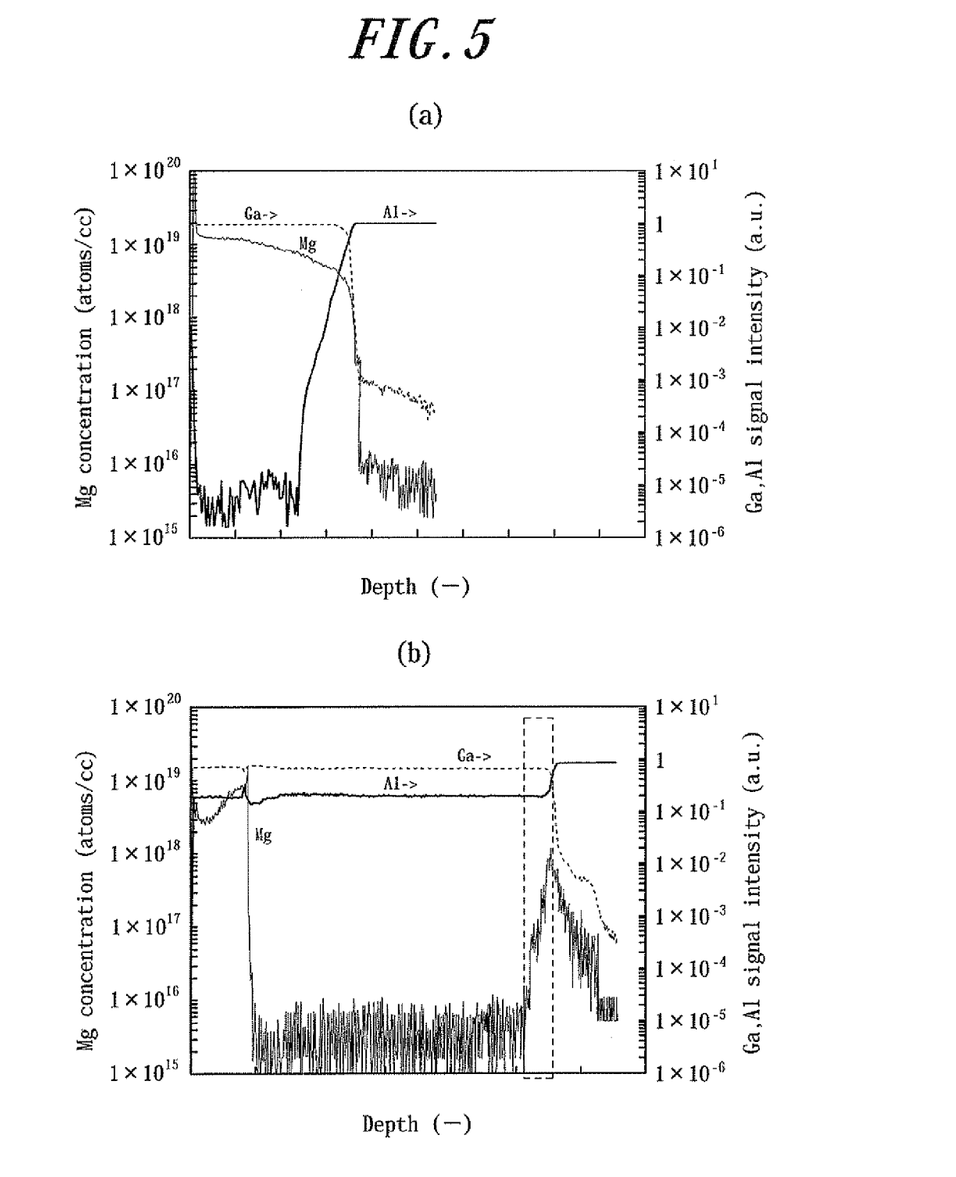
FIG. 5(a) shows a SIMS profile of a GaN single layer formed in a reference example of the present invention.
FIG. 5(b) shows a SIMS profile of a nitride semiconductor device in an example of the present invention.

To measure the amount of Mg contained in the first layers of Example 1, a laminate of only the first layers (GaN) was formed without flowing source gas for second layers (AlN) of Example 1 to measure impurity concentration of the laminate by SIMS. FIG. 5(a) shows the result. The result shows that the concentration of Mg contained in the first layers of Example 1 was $7 \times 10^{17}$ $cm^{-3}$ to $1.7 \times 10^{19}$ $cm^{-3}$. The result further shows that the concentration of Mg contained in the first layers was $7 \times 10^{18}$ $cm^{-3}$ to $1.7 \times 10^{19}$ $cm^{-3}$ at the time of their formation where the influence of the diffusion thereinto was eliminated.

Reference Example 2

Further, in order to measure the concentration of Mg in the whole superlattice strain buffer layer of Example 1, the impurity concentration of the epitaxial laminate was measured by SIMS. FIG. 5(b) shows the result. A portion surrounded by a broken line in FIG. 5(b) corresponds to the superlattice strain buffer layer. Thus, the amount of Mg contained in the relevant region in the superlattice of Example 1 was $7 \times 10^{17}$ $cm^{-3}$ or less. Note that in SIMS, the first layers and the second layers in the superlattice strain buffer layer cannot be measured separately; thus, in the Mg concentration in the FIG. 5(b), the signals from the first layers and signals from the second layers are mixed so that the concentration of the detected Mg in the first layers seems to have been attenuated. Here, the level of diffusion from the first layers to the second layers is not certain. However, since Mg mainly remains in the first layers, the doping amount in the first layers is considered not to have been leveled with that in the second layers.

Example 4

An AlN layer (thickness: 27 nm) was formed as an initial layer by MOCVD on an AlN template having an AlN strain buffer layer on the (0001) plane of a sapphire substrate, and then a superlattice strain buffer layer and an i-type nitride semiconductor layer made of $Al_{0.35}Ga_{0.65}N$ were epitaxially grown sequentially thereon to form an epitaxial laminate. Note that the thickness of the AlN strain buffer layer used was 800 nm, and its dislocation density was $1 \times 10^{10}$ $cm^{-2}$ or less. Here, the superlattice strain buffer layer had a structure in which first layers were made of GaN and a superlattice layer I having 20 sets of alternately stacked AlN layers (thickness: 9 nm) and GaN layers (thickness: 2.1 nm), a superlattice layer II having 30 sets of alternately stacked AlN layers (thickness: 2.7 nm) and GaN layers (thickness: 2.1 nm), and a superlattice layer III having 50 sets of alternately stacked AlN layers (thickness: 0.9 nm) and GaN layers (thickness: 2.1 nm) were sequentially stacked. The GaN layers (first layers) were doped with Mg. In addition, the manufacturing conditions for the superlattice strain buffer layer and the AlN initial layer are the same as those in Example 1.

Figure 6:
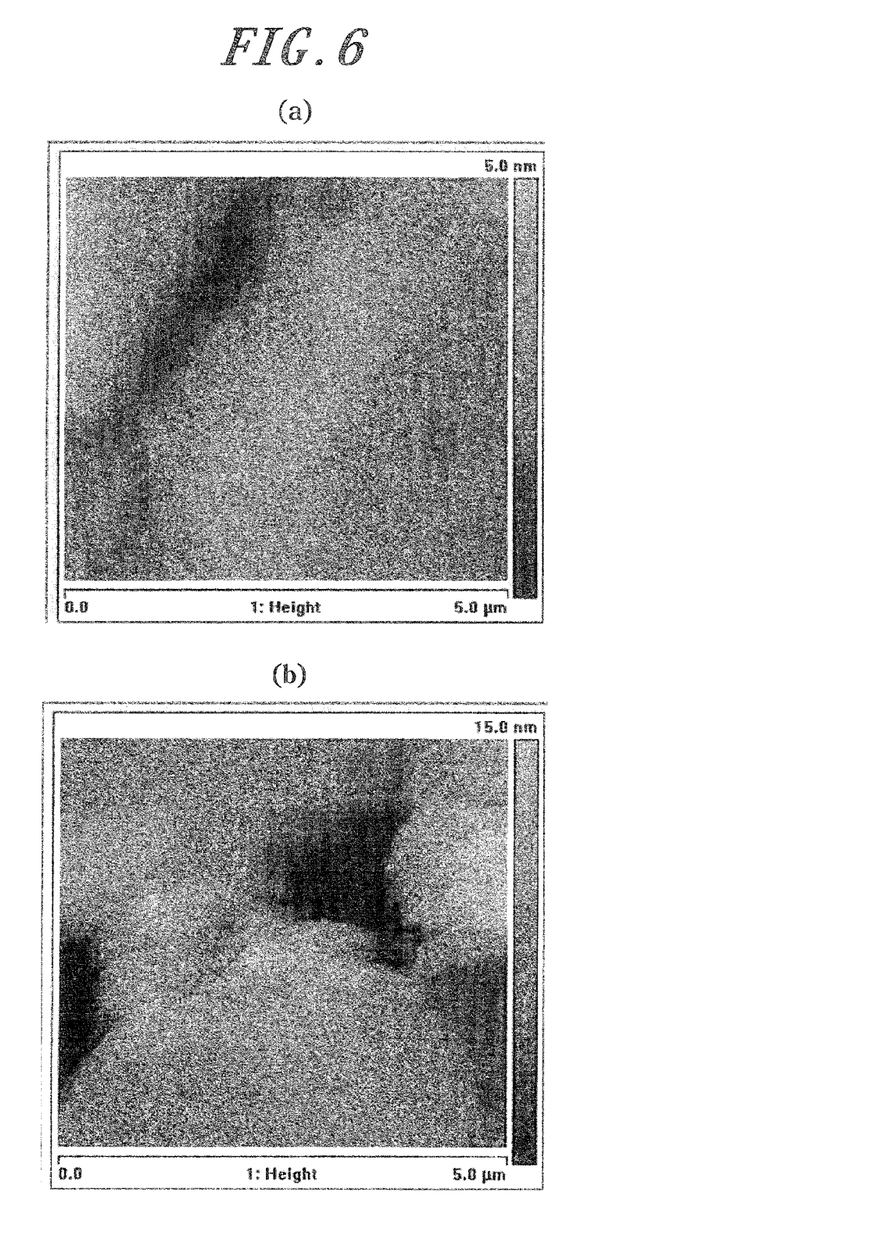
FIG. 6(a) shows an AFM image of the top surface of an i-type nitride semiconductor layer of a nitride semiconductor device in an example of the present invention.
FIG. 6(b) shows an AFM image of the top surface of an i-type nitride semiconductor layer of a nitride semiconductor device in a comparative example of the present invention.

Then, the surface of the i-type nitride semiconductor layer in the obtained epitaxial laminate was observed using AFM to examine the flatness of the surface. As shown in FIG. 6(a), atomic steps corresponding to only one or two atomic layers thick were observed, and the surface roughness Ra was 0.73 nm.

Comparative Example 5

An epitaxial laminate was manufactured in a similar manner to Example 4 except for that GaN layers in a superlattice strain buffer layer were not doped with Mg.

Then, the surface of the i-type nitride semiconductor layer in the obtained epitaxial laminate was observed using AFM to examine the flatness of the surface. As shown in FIG. 6(b), many bunchings corresponding to three or more atomic layers thick were observed, and the Ra value was 2.87 nm.

Example 4 and Comparative Example 5 demonstrated that the flatness of the i-type nitride semiconductor layer formed on the superlattice strain buffer layer can be improved by doping the first layers (GaN layers) with Mg. Thus, the present invention was confirmed to be effective for general semiconductor devices such as light emitting/receiving devices or electronic devices.

INDUSTRIAL APPLICABILITY

According to the present invention, a nitride semiconductor device having high light output power can be provided, in which a superlattice strain buffer layer using AlGaN layers having a low Al content or GaN layers is formed with good flatness on an AlN strain buffer layer on a substrate, and an n-type nitride semiconductor layer with good flatness and crystallinity is formed on the superlattice strain buffer layer.

Further, According to the present invention, a nitride semiconductor device having excellent current characteristics can be provided, in which a superlattice strain buffer layer using AlGaN layers having a low Al content or GaN layers is formed with good flatness on an AlN strain buffer layer on a substrate, and a nitride semiconductor layer with good flatness and crystallinity is formed on the superlattice strain buffer layer.

EXPLANATION OF REFERENCE NUMERALS

1: substrate
2: AlN strain buffer layer
3: superlattice strain buffer layer
4: n-type nitride semiconductor layer
4': nitride semiconductor layer
4'$a$: channel layer
4$b$: electron supply layer
5: light emitting layer
6: p-type nitride semiconductor layer
7: n-side electrode
8: p-side electrode
10: nitride semiconductor device
20: nitride semiconductor device
31: first layers
32: second layers

The invention claimed is:

1. A nitride semiconductor device comprising:
a substrate;
an AlN strain buffer layer made of AlN formed on the substrate;
a superlattice strain buffer layer formed on the AlN strain buffer layer; and
a nitride semiconductor layer formed on the superlattice strain buffer layer,
wherein the superlattice strain buffer layer has a superlattice structure formed by alternately stacking first layers made of $Al_xGa_{1-x}N$ (0≤x≤0.25), which said first layers further contain p-type impurity, and second layers made of AlN, which said second layers are undoped layers.

2. A nitride semiconductor device comprising:
a substrate;
an AlN strain buffer layer made of AlN formed on the substrate;
a superlattice strain buffer layer formed on the AlN strain buffer layer;
an n-type nitride semiconductor layer formed on the superlattice strain buffer layer;
a light emitting layer formed on the n-type nitride semiconductor layer;
a p-type nitride semiconductor layer formed on the light emitting layer;
an n-side electrode electrically coupled to the n-type nitride semiconductor layer; and
a p-side electrode electrically coupled to the p-type nitride semiconductor layer,
wherein the superlattice strain buffer layer has a superlattice structure formed by alternately stacking first layers made of $Al_xGa_{1-x}N$ (0≤x≤0.25), which said first layers further contain p-type impurity, and second layers made of AlN, which said second layers are undoped layers.

3. The nitride semiconductor device according to claim 1, wherein the p-type impurity is any one selected from the group consisting of Mg, Zn, Ca, and Be.

4. The nitride semiconductor device according to claim 1, wherein a thickness of each of the first layers is 0.1 nm to 3 nm.

5. The nitride semiconductor device according to claim 1, wherein a concentration of the p-type impurity in the first layers is $5\times10^{16}$ cm$^{-3}$ or more and less than $2\times10^{19}$ cm$^{-3}$.

6. A method of producing a nitride semiconductor device, comprising the steps of:
forming an AlN strain buffer layer made of AlN on a substrate;
forming a superlattice strain buffer layer on the AlN strain buffer layer; and
forming a nitride semiconductor layer on the superlattice strain buffer layer,
wherein the step of forming the superlattice strain buffer layer is a step of forming a superlattice structure by alternately stacking first layers made of $Al_xGa_{1-x}N$ (0≤x≤0.25), which said first layers further contain p-type impurity, and second layers made of AlN, which said second layers are undoped layers.

7. A method of producing a nitride semiconductor device, comprising the steps of:
forming an AlN strain buffer layer made of AlN on a substrate;
forming a superlattice strain buffer layer on the AlN strain buffer layer;
forming an n-type nitride semiconductor layer on the superlattice strain buffer layer;
forming a light emitting layer on the n-type nitride semiconductor layer;
forming a p-type nitride semiconductor layer on the light emitting layer;
forming an n-side electrode electrically coupled to the n-type nitride semiconductor layer; and
forming a p-side electrode electrically coupled to the p-type nitride semiconductor layer,
wherein the step of forming the superlattice strain buffer layer is a step of forming a superlattice structure by alternately stacking first layers made of $Al_xGa_{1-x}N$ (0≤x≤0.25), which said first layers further contain p-type impurity, and second layers made of AlN, which said second layers are undoped layers.

8. The method of producing a nitride semiconductor device according to claim 7, wherein the step of forming the n-side electrode includes, after forming the p-type nitride semiconductor layer on the light emitting layer, exposing a part of the n-type nitride semiconductor layer on the light emitting layer side, and forming the n-side electrode on the exposed part.

9. The method of producing a nitride semiconductor device according to claim 6, wherein the p-type impurity is any one selected from the group consisting of Mg, Zn, Ca, and Be.

10. The method of producing a nitride semiconductor device according to claim 6, wherein a thickness of each of the first layers is 0.1 nm to 3 nm.

11. The method of producing a nitride semiconductor device according to claim 6, wherein a concentration of the p-type impurity in the first layers is $5\times10^{16}$ cm$^{-3}$ or more and less than $2\times10^{19}$ cm$^{-3}$.

* * * * *